(12) United States Patent
Havel

(10) Patent No.: US 6,281,864 B1
(45) Date of Patent: ***Aug. 28, 2001

(54) DIGITAL DISPLAY SYSTEM FOR VARIABLE COLOR DECIMAL POINT INDICATION

(75) Inventor: Karel Havel, Bramalea (CA)

(73) Assignee: Texas Digital Systems, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/268,769

(22) Filed: Mar. 15, 1999

Related U.S. Application Data

(62) Division of application No. 08/910,080, filed on Aug. 12, 1997, which is a division of application No. 08/571,246, filed on Dec. 12, 1995, now Pat. No. 5,656,935, which is a division of application No. 08/187,350, filed on Jan. 27, 1994, now Pat. No. 5,475,300, which is a division of application No. 07/865,460, filed on Apr. 9, 1992, now Pat. No. 5,283,517, which is a division of application No. 07/628,328, filed on Dec. 14, 1990, now Pat. No. 5,122,733, which is a division of application No. 07/197,322, filed on May 23, 1988, now abandoned, which is a division of application No. 06/819,111, filed on Jan. 15, 1986, now Pat. No. 4,794,383.

(51) Int. Cl.$^7$ .................................................. G09G 3/32

(52) U.S. Cl. ........................... 345/83; 345/600; 345/589; 345/34; 257/89

(58) Field of Search ................................ 345/81, 82, 83, 345/151, 150; 324/96, 99 D; 257/89, 90

(56) References Cited

U.S. PATENT DOCUMENTS

| 2,643,344 | 6/1953 | McLaren et al. . |
| 2,648,015 | 8/1953 | Greenfield et al. . |
| 2,682,000 | 6/1954 | Clayton et al. . |

(List continued on next page.)

FOREIGN PATENT DOCUMENTS

| 3037-500 | 4/1981 | (DE) . |
| 3009416 | 9/1981 | (DE) . |
| 220844A | 4/1985 | (DE) . |
| 2158631A | 11/1985 | (GB) . |
| 357146112A | 9/1982 | (JP) . |

OTHER PUBLICATIONS

SenSym Solid State Barometers Catalog, pp. 9–30, 1983.
Wagner, B., "2–color LED + Drover = Versatile Visual Effects", EDN vol. 25, No. 19, Oct. 20, 1980.
Smithline, L.M., "Dual light emitting diode synthesizes polychromatic light", Electronics, Aug. 16, 1979, p. 130.
Svestka, M. et al, "LED's change color to indicate balance voltage", Electronic Engineering, vol. 48, No. 576, p. 19, Feb. 1976.
Saitoh, T. et al. "Multi–color light emitting diodes with double junction structure". IEEE Transactions on Electron Devices, Feb. 1975, vol. ED–22, No. 2, p. 29–32.
Yamaguchi, T. et al, "A High Brightness Gap Multicolor LED", IEEE Transactions on Electron Devices, vol. ED–28, No. 5, May 1981, p. 588–592.
Baker, M., "Chip changes the color of light emitting diodes", Electronics, Apr. 7, 1981, p. 158–159.
Rao, V., Two LED's blend and blink to indicate six states. Electronic Design, vol. 30, No. 16, p. 220, Aug. 5, 1982.
Kojima, T. "Recent flat panel development in Japan", held in San Diego, CA, Apr. 29 –May 1, 1980. SID 80 Digest, p. 22–23.

(List continued on next page.)

*Primary Examiner*—Dennis-Doon Chow
*Assistant Examiner*—Amr Awad
(74) *Attorney, Agent, or Firm*—James J. Murphy, Esq.; Winstead Sechrest & Minick

(57) ABSTRACT

A variable color light emitting diode digital display system automatically exhibits integers and decimal numbers in different colors. A logic circuit is provided for detecting the presence or absence of a decimal point in a string of digits. The color of the exhibited digits is controlled in accordance with the detection.

3 Claims, 2 Drawing Sheets

U.S. PATENT DOCUMENTS

| | | |
|---|---|---|
| 2,878,450 | 3/1959 | Rabier . |
| 2,889,518 | 6/1959 | Hudson et al. . |
| 3,595,991 | 7/1971 | Diller . |
| 3,719,849 | 3/1973 | Steward . |
| 3,740,570 | 6/1973 | Kaelin et al. . |
| 3,760,174 | 9/1973 | Boening et al. . |
| 3,771,155 | 11/1973 | Hayashi et al. . |
| 3,840,873 | 10/1974 | Usui . |
| 3,873,979 | 3/1975 | Craford et al. . |
| 3,911,418 | 10/1975 | Takeda . |
| 3,924,227 | 12/1975 | Stolov . |
| 3,975,726 | 8/1976 | Kawakami . |
| 4,086,514 | 4/1978 | Havel . |
| 4,163,230 * | 7/1979 | Konii ............................ 368/84 |
| 4,176,318 * | 11/1979 | Johnson et al. ............... 455/115 |
| 4,271,408 | 6/1981 | Teshima et al. . |
| 4,301,450 | 11/1981 | Smoliar . |
| 4,360,804 | 11/1982 | Ohura . |
| 4,488,149 | 12/1984 | Givens, Jr. . |
| 4,559,480 | 12/1985 | Nobs . |
| 4,581,612 | 4/1986 | Jones . |
| 4,689,613 | 8/1987 | Ikeda . |
| 4,720,709 | 1/1988 | Imamura et al. . |
| 4,740,818 | 4/1988 | Tsilibes et al. . |
| 5,003,298 | 3/1991 | Havel . |

OTHER PUBLICATIONS

Niina, T. et al, "A multi–color GaP LED flat panel display device" Held New York, NY, USA, Apr. 28–30, 1981. 1981 SID International Symposiun Digest of Papers, vol. XII (1981), p. 140–141.

Niina, T. et al, "A multi–color LED flat panel display device for colorful displays of letters and figures". Proceedings of the SID, vol. 23, No. 2, p. 73–76, 1982.

O'Mara, P.A. et al, "Microprocessor–controlled light emitting diode dark adaptometer". Medical & Biological Engineering and Computing, vol. 20, No. 1, p. 70–76, 1982.

Landauer, R. W., "Electroluminescent Display", IBM Technical Disclosure Bulletin, vol. 8, No. 11, pp. 15–16, Apr. 11, 1966.

* cited by examiner

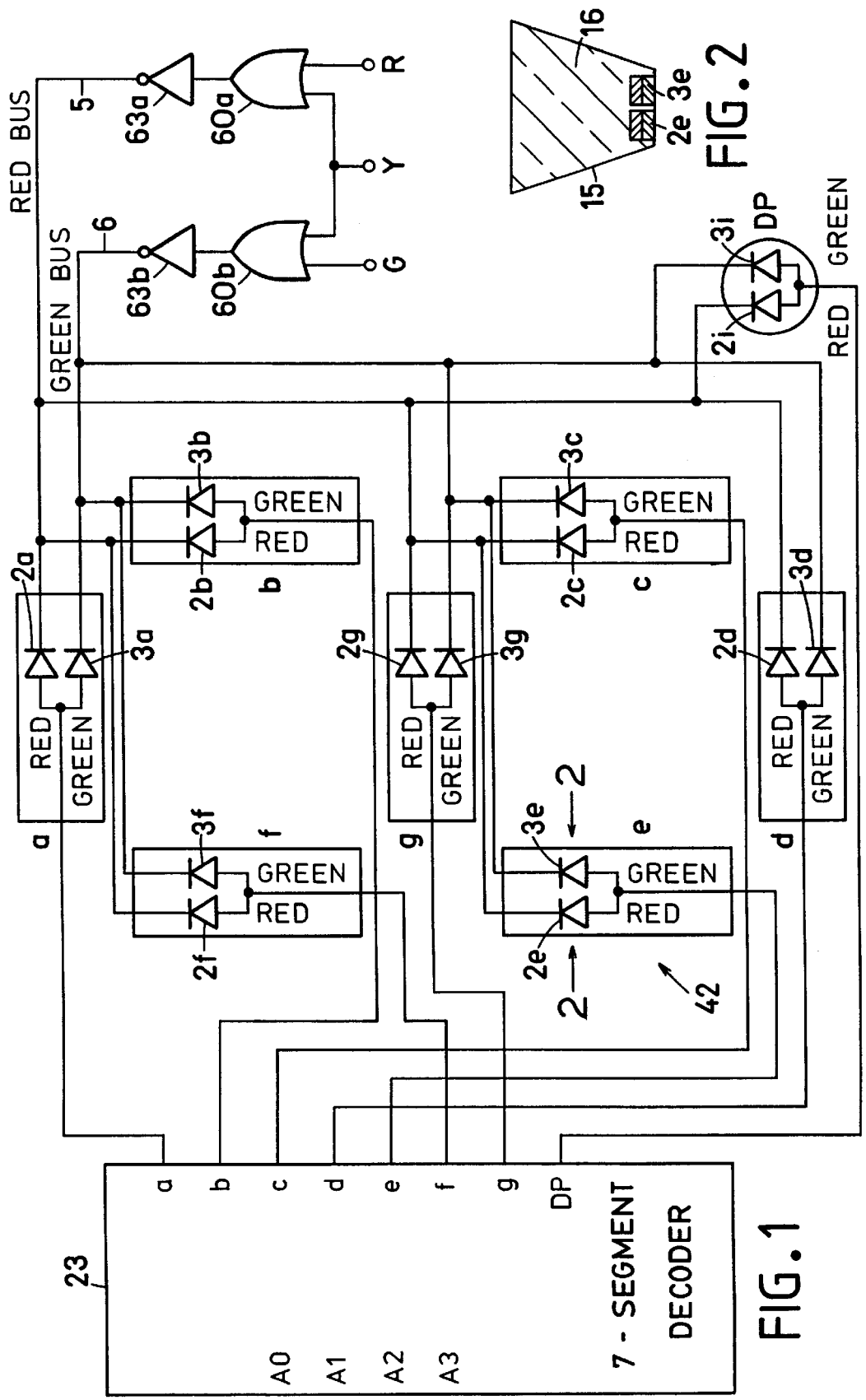

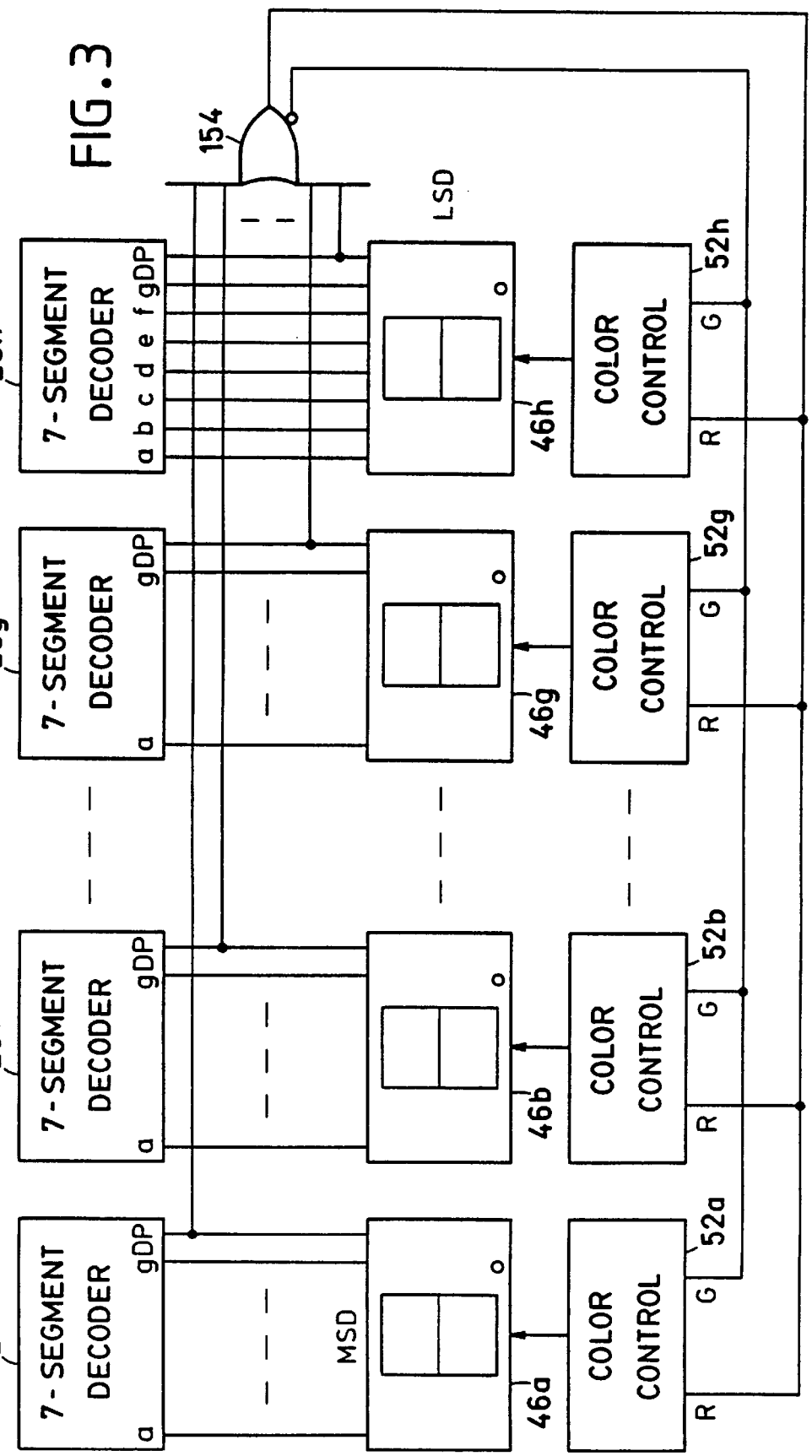

US 6,281,864 B1

DIGITAL DISPLAY SYSTEM FOR VARIABLE COLOR DECIMAL POINT INDICATION

CROSS-REFERENCE TO RELATED APPLICATIONS

This is a division of my copending application Ser. No. 08/910,080, filed on Aug. 12, 1997, entitled Variable Color Display System, which is a division of my application Ser. No. 08/571,246, filed on Dec. 12, 1995, entitled Variable Color Display System, now U.S. Pat. No. 5,656,935 issued on Aug. 12, 1997, which is a division of my application Ser. No. 08/187,350, filed on Jan. 27, 1994, entitled Variable Color Digital Multimeter, now U.S. Pat. No. 5,475,300 issued on Dec. 12, 1995, which is a division of my application Ser. No. 07/865,460, filed on Apr. 9, 1992, entitled Variable Color Digital Multimeter, now U.S. Pat. No. 5,283,517 issued on Feb. 1, 1994, which is a division of my application Ser. No. 07/628,328, filed on Dec. 14, 1990, entitled Variable Color Digital Multimeter, now U.S. Pat. No. 5,122,733 issued on Jun. 16, 1992, which is a division of my application Ser. No. 07/197,322, filed on May 23, 1988, entitled Variable Color Digital Multimeter, now abandoned, which is a division of my application Ser. No. 06/819,111, filed on Jan. 15, 1986, entitled Variable Color. Digital Multimeter, now U.S. Pat. No. 4,794,383 issued on Dec. 27, 1988.

Reference is also made to my related applications Ser. No. 06/817,114, filed on Jan. 8, 1986, entitled Variable Color Digital Timepiece, now U.S. Pat. No. 4,647,217 issued on Mar. 3, 1987, Ser. No. 06/839,526, filed on Mar. 14, 1986, entitled Variable Color Display Telephone, now U.S. Pat. No. 4,726,059 issued on Feb. 16, 1988, Ser. No. 06/940/100, filed on Dec. 10, 1986, entitled Digital Voltmeter with Variable Color Background, now U.S. Pat. No. 4,831,326 issued on May 16, 1989, Ser. No. 06/922,847, filed on Oct. 24, 1986, entitled Continuously Variable Color Display Device, now U.S. Pat. No. 4,845,481 issued on Jul. 4, 1989, Ser. No. 07/322,341, filed on Mar. 13, 1989, entitled Continuously Variable Color Optical Device, now U.S. Pat. No. 4,965,561 issued on Oct. 23, 1990, Ser. No. 07/379,616, filed on Jul. 14, 1989, entitled Variable Color Digital Display for Emphasizing Position of Decimal Point, now U.S. Pat. No. 5,003,298 issued on Mar. 26, 1991, Ser. No. 06/920,740, filed on Oct. 20, 1986, entitled Step Variable Color Display Device, now abandoned, Serial No. 06/931,626, filed on Nov. 17, 1986, entitled Variable Color Hybrid Display Device, now abandoned, and Ser. No. 07/157,603, filed on Feb. 19, 1988, entitled Variable Color Multiplexed Display System, now abandoned, which describe the devices employing a variable color display.

BACKGROUND OF THE INVENTION

1. Field of the Invention

This invention relates to variable color display devices utilizing light emitting diodes.

2. Description of the Prior Art

The difficulty of rapidly detecting the presence of a decimal point in a long string of digits, displayed on a multi-element digital display which includes a large number of display segments, is appreciated in the prior art.

A monochromatic multi-digit display disclosed in U.S. Pat. No. 3,719,849, issued on Mar. 6, 1973 to Robert L. Stewart, dedicates one digit position to a decimal point. When a string of digits is displayed, only the decimal point is energized on one display digit to provide wide separation between the decimal point and its nearby digits, for improving the readability of the decimal point in a long string of digits.

An electronic display having segments wherein each segment is capable of selectively illuminating two colors is disclosed in U.S. Pat. No. 4,488,149 issued on Dec. 11, 1984 to William A. Givens, Jr. Two AND gates are provided for biasing, in each display segment, either a first light emitting diode, for emitting a first color, or a second light emitting diode, for emitting a second color. It is not contemplated to illuminate both light emitting diodes in each segment simultaneously for blending the colors.

The prior art does not contemplate a display system for automatically exhibiting integers and decimal numbers in different colors.

SUMMARY OF THE INVENTION

It is the principal object of this invention to provide an improved variable color display device.

It is another object of the invention to provide a variable color display device using two primary color LEDs.

It is still another object of the invention to automatically detect the presence of a decimal point in a string of exhibited display digits.

It is still another object of the invention to provide a variable color display system for automatically exhibiting integers and decimal numbers in different colors.

Other objects of the invention will be obvious from the appended drawings and their description.

In summary, a variable color display system of the invention includes a plurality of light emitting diode display elements, respectively driven by decoders, each for providing a single digit indication with a decimal point. Each display element includes two color control inputs for controlling its color in response to a color control signal. The color control inputs of all display elements are respectively interconnected for controlling the color of the display elements uniformly. A gate is provided for detecting the conditions of the decimal points of all display elements. The inputs of the gate are respectively connected to the decimal point outputs of the decoders. The output of the gate is coupled to the interconnected color control inputs of the display elements. When no decimal point output is active, the display elements illuminate in a first color. When some decimal point output is active, the display elements illuminate in a second color.

BRIEF DESCRIPTION OF THE DRAWINGS

In the drawings in which are shown the preferred embodiments of the invention,

FIG. 1 is a schematic diagram of a single 2-primary color 7-segment display device.

FIG. 2 is an enlarged cross-sectional view of one display segment in FIG. 1, taken along the line 2—2.

FIG. 3 is a simplified schematic diagram of a variable color display system for displaying integers and decimal numbers in respectively different colors.

Throughout the drawings, like characters indicate like parts.

DESCRIPTION OF THE PREFERRED EMBODIMENTS

Referring now, more particularly, to the drawings, in FIG. 1 is shown a schematic diagram of a 2-primary color common cathodes 7-segment display element 42 which can selectively display various digital fonts in different colors on display segments a, b, c, d, e, f, g, and DP (decimal point). Each display segment includes a pair of LEDs (light emitting diodes): red LED 2 and green LED 3, which are closely adjacent such that the light signals emitted therefrom are substantially superimposed upon each other to mix the colors. To facilitate the illustration, the LEDs are designated by segment symbols, e. g., the red LED in the segment a is designated as 2a, etc.

The anodes of all red and green LED pairs are interconnected in each display segment and are electrically connected to respective outputs of a commercially well known common-cathode 7-segment decoder 23. The cathodes of all red LEDs 2a, 2b, 2c, 2d, 2e, 2f, 2g, and 2i are interconnected to a common electric path referred to as a red bus 5. The cathodes of all green LEDs 3a, 3b, 3c, 3d, 3e, 3f, 3g, and 3i are interconnected to a like common electric path referred to as a green bus 6.

The red bus 5 is connected to the output of an inverting buffer 63a, capable of sinking sufficient current to forwardly bias all red LEDs 2a to 2i in display element 42. The green bus 6 is connected to the output of a like buffer 63b. The conditions of red bus 5 and green bus 6 can be controlled by applying suitable logic control signals to the color control inputs R (red), Y (yellow), and G (green), to illuminate display element 42 in a selected color.

The operation of display element 42 will be now explained by the example of illuminating a digit '7' in three different colors. Any digit between 0 and 9 can be selectively displayed by applying the appropriate BCD code to the inputs A0, A1, A2, and A3 of common-cathode 7-segment decoder 23. The decoder 23 develops at its outputs a, b, c, d, e, f, g, and DP drive signals for energizing selected groups of the segments to visually display the selected number, in a manner well known to those skilled in the art. To display decimal number '7', a PCD code 0111 is applied to the inputs A0, A1, A2, and A3. The decoder 23 develops high voltage levels at its outputs a, b, and c, to illuminate equally designated segments a, b, and c, and low voltage levels at all remaining outputs (not shown), to extinguish all remaining segments d, e, f, g, and DP.

To illuminate display element 42 in red color, the color control input R is raised to a high logic level, and the color control inputs Y and G are maintained at a low logic level. As a result, the output of OR gate 60a rises to a high logic level, thereby causing the output of buffer 63a to drop to a low logic level. The current flows from the output a of decoder 23, via red LED 2a and red bus 5, to current sinking output of buffer 63a. Similarly, the current flows from the output b of decoder 23, via red LED 2b and red bus 5, to the output of buffer 63a. The current flows from the output c of decoder 23, via red LED 2c and red bus 5, to the output of buffer 63a. As a result, segments a, b, and c illuminate in red color, thereby causing a visual impression of a character '7'. The green LEDs 3a, 3b, and 3c remain extinguished because the output of buffer 63b is at a high logic level, thereby disabling green bus 6.

To illuminate display element 42 in green color, the color control input G is raised to a high logic level, while the color control inputs R and Y are maintained at a low logic level. As a result, the output of OR gate 60b rises to a high logic level, thereby causing the output of buffer 63b to drop to a low logic level. The current flows from the output a of decoder 23, via green LED 3a and green bus 6, to current sinking output of buffer 63b. Similarly, the current flows from the output b of decoder 23, via green LED 3b and green bus 6, to the output of buffer 63b. The current flows from the output c of decoder 23, via green LED 3c and green bus 6, to the output of buffer 63b. As a result, segments a, b, and c illuminate in green color. The red LEDs 2a, 2b, and 2c remain extinguished because the output of buffer 63a is at a high logic level, thereby disabling red bus 5.

To illuminate display element 42 in yellow color, the color control input Y is raised to a high logic level, while the color inputs R and G are maintained at a low logic level. As a result, the outputs of both OR gates 60a and 60b rise to a high logic level, thereby causing the outputs of both buffers 63a and 63b to drop to a low logic level. The current flows from the output a of decoder 23, via red LED 2a and red bus 5, to current sinking output of buffer 63a, and, via green LED 3a and green bus 6, to current sinking output of buffer 63b. Similarly, the current flows from the output b of decoder 23, via red LED 2b and red bus 5, to the output of buffer 63a, and, via green LED 3b and green bus 6, to the output of buffer 63b. The current flows from the output c of decoder 23, via red LED 2c and red bus 5, to the output of buffer 63a, and, via green LED 3c and green bus 6, to the output of buffer 63b. As a result of blending light of red and green colors in each segment, segments a, b, and c illuminate in substantially yellow color.

In FIG. 2, red LED 2e and green LED 3e are placed on the base of a segment body 15 which is filled with a transparent light scattering material 16. When forwardly biased, LEDs 2e and 3e emit light signals of red and green colors, respectively, which are scattered within transparent material 16, thereby blending the red and green light signals into a composite light signal that emerges at the upper surface of segment body 15. The color of the composite light signal may be controlled by varying the portions of the red and green light signals.

The display system shown in FIG. 3 is capable of detecting the presence or absence of a decimal point in the displayed digital string, and accordingly of displaying the digital strings with decimal point (decimal numbers) in a first color, and the digital strings without decimal point (integers) in a different color. The decimal point outputs DP of all common-cathode 7-segment decoders 23a to 23h are respectively connected to the inputs of an OR gate 154. When decimal point is present in the displayed digital string, the appropriate DP output rises to a high logic level, thereby forcing the non-inverting output of OR gate 154, which is connected to interconnected color control inputs R of all color control circuits 52a to 52h, to rise to a high logic level, to thereby cause all display characters 46a to 46h to illuminate in red color. When no decimal point is detected in the displayed digital string, the inverting output of OR gate 154, which is connected to interconnected color control inputs G of all color control circuits 52a to 52h, rises to a high logic level, to thereby cause all display characters 46a to 46h to illuminate in green color. The colors used in the example are merely exemplary. It would be obvious to those skilled in the art, in the view of this disclosure, that other color combinations may be devised.

In brief summary, the invention describes a variable color display system which includes a plurality of side by side positioned variable color single-digit light emitting diode display elements on which a string of digits with or without a decimal point may be exhibited. The display elements are respectively driven by decoders. Each display element includes two color control inputs for controlling its color in response to a color control signal. The color control inputs of all display elements are respectively interconnected for controlling the color of the display elements uniformly. A logic device is provided for detecting the presence of a decimal points in the exhibited string of digits. The logic device has its inputs respectively connected to the decimal point outputs of the decoders and its output connected to the interconnected color control inputs of the display elements. When no decimal point output is detected, the output of the logic device activates the interconnected color control inputs for illuminating the display elements in a first color. When a decimal point is detected, the output of the logic device activates the interconnected color control inputs for illuminating the display elements in a second color.

It would be obvious, in the view of the present disclosure, that the hardware design of the present invention may be also implemented by software. It would be further obvious that persons skilled in the art may resort to modifications in the construction of the preferred embodiment described herein, without departing from the spirit and scope of the invention as defined in the appended claims. It is contemplated that the principles of the invention are also applicable to numerous diverse types of display devices, such as luminescent devices, liquid crystal display devices, plasma display devices, cathode ray tube display devices, and the like.

CORRELATION TABLE

This is a correlation table of reference characters used in the drawings herein, their descriptions, and examples of commercially available parts.

| # | DESCRIPTION | EXAMPLE |
|---|---|---|
| 2 | red LED | |
| 3 | green LED | |
| 5 | red bus | |
| 6 | green bus | |
| 15 | segment body | |
| 16 | light scattering material | |
| 23 | common cathode 7-segment decoder | 74LS49 |
| 42 | variable color 7-segment display element | |
| 46 | one variable color 7-segment display character | |
| 52 | color control (2 LEDs) | |
| 60 | 2-input OR gate | 74HC32 |
| 63 | inverting buffer | 74LS240 |
| 154 | 8-input OR/NOR gate | 74HC4078 |

The parts shown in the Correlation Table are merely exemplary. It would be obvious to those skilled in the art that other components may be readily and effectively used.

What I claim is:

1. A display system comprising:
    a plurality of adjacent variable color digital display elements, each said display element including a plurality of display segments and a decimal point segment for selectively exhibiting a plurality of strings of digits with a decimal point, each said display element including a color control input for illuminating it in a color in accordance with a color control signal, the color control inputs of all said display elements being interconnected;
    decoder means having a plurality of inputs for receiving input codes defining a string of digits with or without a decimal point, a plurality of decoder outputs for developing drive signals for selectively energizing said display segments, and a plurality of decimal point outputs for developing drive signals for energizing a certain of said decimal point segments, if the decimal point is present in said string of digits;
    means responsive to said decoder outputs and to said decimal point outputs for exhibiting on said display means the string of digits which may include a decimal point;
    means for interrogating said decimal point outputs to determine whether there is a decimal point in the string of digits and for developing an output signal accordingly; and
    color control means for coupling said output signal to the interconnected color control inputs for illuminating all digits in the string in a first color when said decimal point was detected, and in a second color when said decimal point was not detected.

2. A display system comprising:
    a plurality of adjacent variable color digital display elements, each said display element including a plurality of display segments and a decimal point segment for selectively exhibiting a plurality of strings of digits with a decimal point, each said display element including a color control input for illuminating it in a color in accordance with a color control signal, the color control inputs of all said display elements being interconnected;
    decoder means having a plurality of inputs for receiving input codes defining a string of digits with or without a decimal point, a plurality of decoder outputs for developing drive signals for selectively energizing said display segments, and a plurality of decimal point outputs for developing drive signals for energizing a certain of said decimal point segments, if the decimal point is present in said string of digits;
    means responsive to said decoder outputs and to said decimal point outputs for exhibiting on said display means the string of digits which may include a decimal point;
    a logic device including a plurality of logic inputs equal in number to the plurality of said decoders, said inputs being respectively connected to said decimal point outputs of said decoders, and a logic output, for developing an output logic signal in accordance with the conditions of said decimal point decoder outputs; and
    color control means for coupling said logic output to the interconnected color control inputs, for illuminating all digits in the string in a first color when said decimal point was detected, and in a second color when said decimal point was not detected.

3. A display system comprising:
    a plurality of side by side positioned variable color light emitting diode digital display elements, each said display element including a plurality of display segments and a decimal point segment, each said display element including a first color control input for illuminating upon activation said display element in a first color, and a second color control input for illuminating upon activation said display element in a second color, said first color control inputs and said second color control inputs of all said display elements being respectively interconnected;
    a plurality of decoders equal in number to the plurality of said display elements and respectively associated with said display elements, each said decoder having a plurality of inputs for receiving an input code defining a digit, a plurality of decoder outputs for developing drive signals for energizing selective groups of display segments in the associated display element, and a decimal point output for developing an active decimal point drive signal for energizing the decimal point segment in the associated display element, when there is a decimal point in said string of digits;

means responsive to the decoder outputs and to the decimal point outputs for exhibiting on said display elements a string of digits which may include a decimal point;

a logic device including a plurality of logic inputs equal in number to the plurality of said decoders, said inputs being respectively connected to said decimal point outputs of said decoders, a first logic output for developing an active logic signal when said active decimal point drive signal is detected, and a second logic output for developing an active logic signal when said active decimal point drive signal is not detected; and color control means for coupling said first logic output to the interconnected first color control inputs, and for coupling said second logic output to the interconnected second color control inputs.

\* \* \* \* \*

UNITED STATES PATENT AND TRADEMARK OFFICE
CERTIFICATE OF CORRECTION

PATENT NO. : 6,281,864 B1  
DATED : August 28, 2001  
INVENTOR(S) : Havel

Page 1 of 1

It is certified that error appears in the above-identified patent and that said Letters Patent is hereby corrected as shown below:

Column 1,  
Line 33, after "Ser. No. 06/940" delete [/] and insert -- , --;

Column 3,  
Line 38, after "decimal number '7', delete [PCD] and insert -- BCD --

Signed and Sealed this

Sixteenth Day of April, 2002

Attest:

JAMES E. ROGAN  
*Attesting Officer*   *Director of the United States Patent and Trademark Office*